(12) United States Patent
Chen et al.

(10) Patent No.: US 9,196,545 B2
(45) Date of Patent: Nov. 24, 2015

(54) SIGE SRAM BUTTED CONTACT RESISTANCE IMPROVEMENT

(71) Applicant: Taiwan Semiconductor Manufacturing Co., Ltd., Hsin-Chu (TW)

(72) Inventors: Chao-Hsuing Chen, Tainan (TW); Ling-Sung Wang, Tainan (TW); Chi-Yen Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/305,427

(22) Filed: Jun. 16, 2014

(65) Prior Publication Data

US 2014/0295630 A1    Oct. 2, 2014

Related U.S. Application Data

(62) Division of application No. 13/494,157, filed on Jun. 12, 2012, now Pat. No. 8,766,256.

(51) Int. Cl.

| | |
|---|---|
| *H01L 21/8238* | (2006.01) |
| *H01L 27/088* | (2006.01) |
| *H01L 27/11* | (2006.01) |
| *H01L 27/02* | (2006.01) |
| *H01L 21/768* | (2006.01) |
| *H01L 29/78* | (2006.01) |
| *H01L 29/06* | (2006.01) |

(Continued)

(52) U.S. Cl.
CPC .. *H01L 21/823814* (2013.01); *H01L 21/76895* (2013.01); *H01L 21/823475* (2013.01); *H01L 21/823878* (2013.01); *H01L 27/0207* (2013.01); *H01L 27/088* (2013.01); *H01L 27/1104* (2013.01); *H01L 29/0688* (2013.01); *H01L 29/165* (2013.01); *H01L 29/7848* (2013.01); *H01L 21/823412* (2013.01); *H01L 21/823418* (2013.01)

(58) Field of Classification Search
CPC ............... H01L 21/823814; H01L 21/823878; H01L 29/7848; H01L 29/165; H01L 29/0688; H01L 21/76895; H01L 21/823475; H01L 21/823418; H01L 21/823412
See application file for complete search history.

(56) References Cited

U.S. PATENT DOCUMENTS

| | | |
|---|---|---|
| 6,339,229 B1 | 1/2002 | Shiga et al. |
| 6,833,595 B1 | 12/2004 | Iwasaki |
| 8,004,042 B2 | 8/2011 | Yang et al. |

(Continued)

OTHER PUBLICATIONS

Office Action Dated Sep. 6, 2013 U.S. Appl. No. 13/494,157.

(Continued)

*Primary Examiner* — David Vu
(74) *Attorney, Agent, or Firm* — Eschweiler & Associates, LLC

(57) ABSTRACT

The present disclosure relates to a method for fabricating a butted a contact arrangement configured to couple two transistors, wherein an active region of a first transistor is coupled to a gate of a second transistor. The gate of the second transistor is formed from a gate material which comprises a dummy gate of the first transistor, and is configured to straddle a boundary between the active region of the first transistor and an isolation layer formed about the first transistor. The butted a contact arrangement results in a decreased contact resistance for the butted contact as compared to previous methods.

20 Claims, 7 Drawing Sheets

(51) Int. Cl.
  *H01L 29/165* (2006.01)
  *H01L 21/8234* (2006.01)

(56) References Cited

U.S. PATENT DOCUMENTS

| | | | |
|---|---|---|---|
| 8,228,069 | B2 | 7/2012 | Lee et al. |
| 2006/0192254 | A1 | 8/2006 | Yokoyama |
| 2006/0270071 | A1 | 11/2006 | Chang et al. |
| 2007/0080423 | A1 | 4/2007 | Tsuboi et al. |
| 2009/0002012 | A1 | 1/2009 | Doong et al. |
| 2009/0020755 | A1 | 1/2009 | Chung et al. |
| 2010/0013514 | A1 | 1/2010 | Lee et al. |
| 2012/0119209 | A1 | 5/2012 | Lee |
| 2013/0065329 | A1 | 3/2013 | Kronholz et al. |

OTHER PUBLICATIONS

Notice of Allowance Dated Feb. 28, 2014 U.S. Appl. No. 13/494,157.

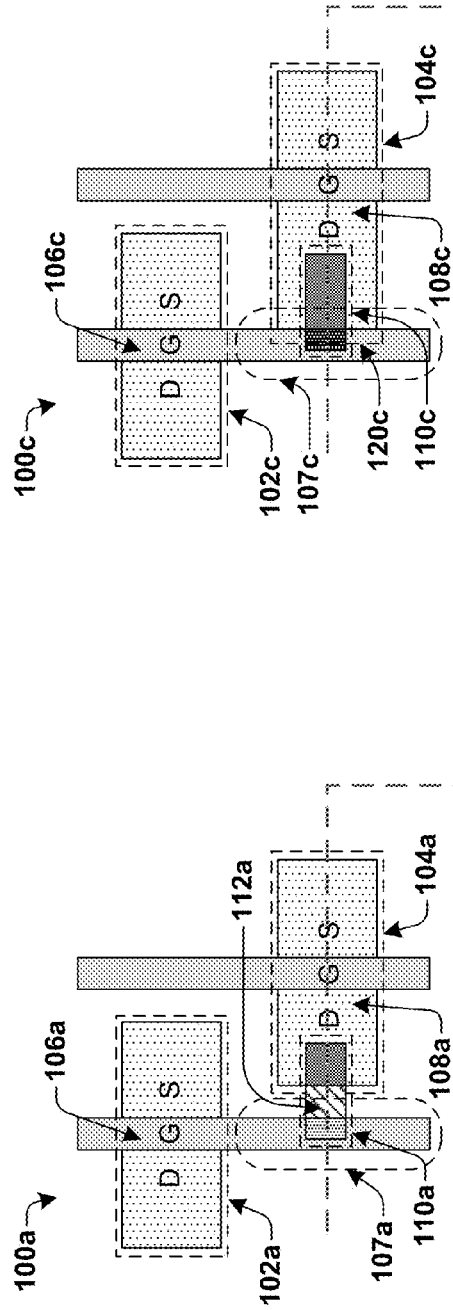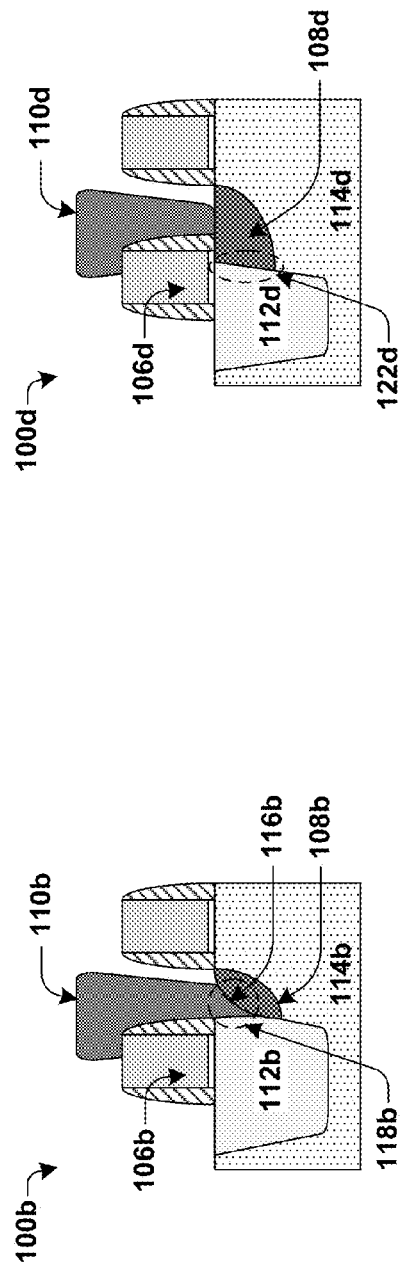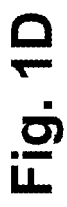

SIGE SRAM BUTTED CONTACT RESISTANCE IMPROVEMENT

REFERENCE TO RELATED APPLICATION

This application is a divisional of U.S. application Ser. No. 13/494,157 filed on Jun. 12, 2012, which is incorporated herein by reference in its entirety.

BACKGROUND

To achieve the continued scaling of semiconductor device density in accordance with Moore's law while maintaining or even exceeding current power and performance standards, new manufacturing methods have been introduced which target specific device performance parameters. Methods such as high-K metal gates to decrease device leakage, strain inducing channels for increased charge carrier mobility, and butted contacts for increased wiring density are a few examples of methods to continue Moore's Law scaling for next generation microprocessor designs.

BRIEF DESCRIPTION OF THE DRAWINGS

FIG. 1A illustrates a semiconductor device arrangement for coupling of transistors.

FIG. 1B illustrates a cross-sectional view of a semiconductor device arrangement, wherein a butted contact couples a gate of a first transistor to a drain of a second transistor.

FIG. 1C illustrates some embodiments of a semiconductor device arrangement for coupling of transistors.

FIG. 1D illustrates a cross-sectional view of a semiconductor device arrangement, wherein a butted contact couples a gate of a first transistor to a drain of a second transistor.

DETAILED DESCRIPTION

Figure 2:
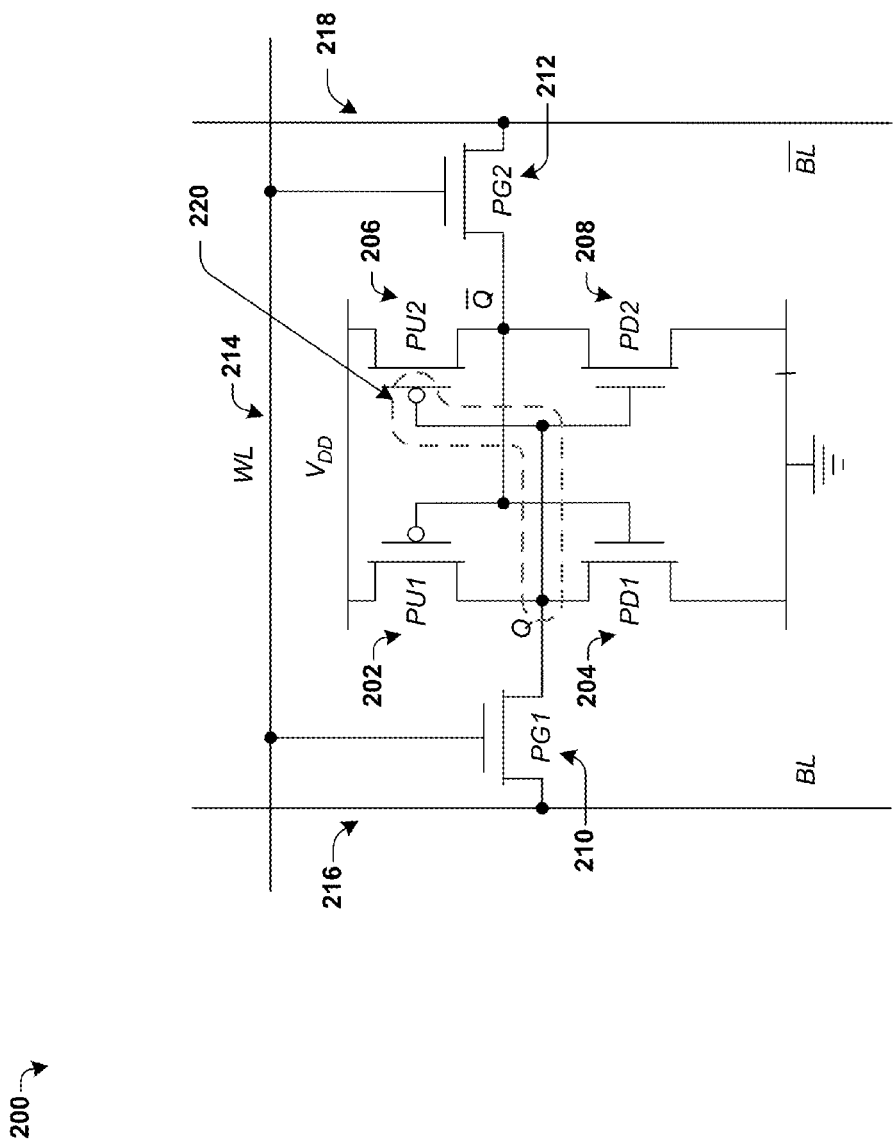
FIG. 2 illustrates an SRAM memory cell schematic.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates a semiconductor device arrangement 100a for coupling of transistors, comprising a first transistor 102a and a second transistor 104a. In certain circuit applications it is desired to couple the gate structure 106a of the first transistor 102a to the drain 108a of the second transistor 104a. In general the coupling of two transistors may be achieved by connecting them through a metallization layer (not shown). However, the area overhead involved with utilizing the metallization layer may be overly-restrictive for dense circuit applications such as Static Random-Access Memory SRAM or embedded Dynamic Random-Access Memory (eDRAM) layouts. As such, a more area-efficient method is desired. One method to optimize area-efficiency is to utilize a butted contact 110a to tie a first gate structure 106a (e.g., a gate material that forms the first gate structure 106a of the first transistor 102a and a dummy gate 107a) to the drain 108a of a second transistor 104a. It will be appreciated to one of skill in the art that a butted contact may be utilized in general for coupling of a terminal of a first transistor to a terminal of a second transistor, wherein a terminal comprises a source, a drain, a gate, or any combination thereof.

To achieve the desired electrical performance, a low contact resistance is desired between the butted contact 110a and the terminal that it touches. For the semiconductor device arrangement 100a the butted contact 110a not only touches the gate structure 106a and the drain 108a, but also a region 112a outside both the first transistor 102a and the second transistor 104a, adding contact resistance to the butted contact 110a.

FIG. 1B illustrates a cross-sectional view 100b of the semiconductor device arrangement 100a formed on a substrate 114b, wherein a butted contact 110b couples a first gate structure 106b (e.g., a gate material) of a first transistor to a drain 108b of a second transistor. An isolation layer 112b surrounds and abuts the drain 108b in a manner to isolate it from other devices on the substrate 114b. For certain types of source/drain materials (e.g., strained SiGe), a facet 116b may form on an edge of the drain 108b at an interface to the isolation layer 112b. As a result, the butted contact 110b does not have a smooth surface on which to land, but rather topographical variation 118b around the facet 116b. The butted contact 110b therefore forms such that it fills in the topographical variation 118b and touches both the facet 116b on an edge of the drain 108b as well as the isolation layer 112b. This results in an increased contact resistance of the butted contact 110b. The increased contact resistance demonstrates measured values of between approximately 6,000 Ω and approximately 60,000 Ω as opposed to a measured value of approximately 60 Ω for a well-formed contact.

Accordingly, the present disclosure relates to a method for fabricating a butted a contact arrangement configured to couple two transistors, wherein an active region of a first transistor is coupled to a gate of a second transistor. The gate of the second transistor is formed from a gate structure which also makes up a dummy gate, and is configured to straddle a boundary between the active region of the first transistor and an isolation layer formed about the first transistor. The butted contact arrangement results in a decreased contact resistance for the butted contact as compared to previous methods.

FIG. 1C illustrates some embodiments of a semiconductor device arrangement 100c for coupling of transistors comprising a first transistor 102c and a second transistor 104c, wherein a drain 108c of the second transistor 104c has been extended such that its edge 120c lies under a dummy gate 107c that overlies a second active region corresponding to the second transistor 104c. For the semiconductor device arrangement 100c the butted contact 110c touches only the first gate structure 106c (particularly the dummy gate portion thereof) and the drain 108c.

FIG. 1D illustrates some embodiments of a cross-sectional view 100d of the semiconductor device arrangement 100c formed on a substrate 114d, wherein a butted contact 110d couples a dummy gate 106d of a first transistor to a drain 108d of a second transistor. An isolation layer 112d surrounds and abuts the drain 108d. Unlike the cross-sectional view 100b, wherein the facet 116b resulted in topographical variation 118b, the embodiments of a cross-sectional view 100d result in a relatively flat interface between the butted contact 110d and the drain 108d due to the formation of the boundary region 122d under the dummy gate 106d. This results in a decreased contact resistance of approximately 60 Ω for the butted contact 110b.

FIG. 2 illustrates an SRAM memory cell schematic 200, comprising storage cell comprising two cross-coupled inverters, a first inverter comprising a first p-type Field-Effect Transistor (PFET) 202 and a first n-type Field-Effect Transistor (NFET) 204, and a second inverter comprising a second p-type Field-Effect Transistor (PFET) 206 and a second n-type Field-Effect Transistor (NFET) 208. A third NFET 210 and a fourth NFET 212 control access to a storage cell through a word line (WL) 214 which is coupled to their gates, thus controlling whether the storage cell is connected to a first bit line (BL) 216 and a second bit line ($\overline{BL}$) 218. To achieve scaling of an SRAM memory cell layout corresponding to the SRAM memory cell schematic 200 in accordance with Moore's law, a butted contact may be used to form a coupling connection 220 between the cross-coupled inverters (shown here as a connection between a drain of the first PFET 202 and a gate of the second PFET 206).

Figure 3A:
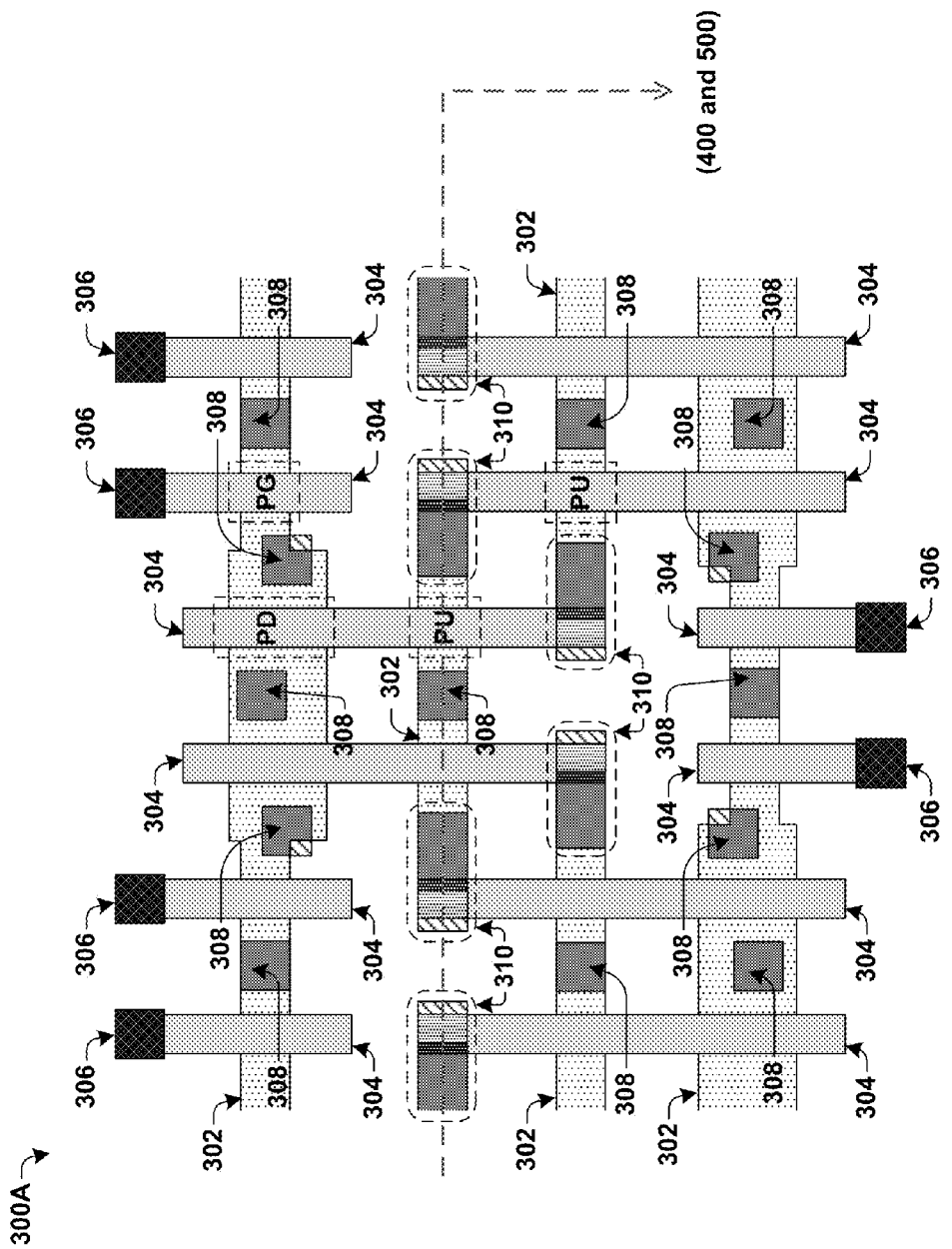
FIG. 3A illustrates an SRAM memory cell layout.

FIG. 3A illustrates an SRAM memory cell layout 300A, comprising a plurality of active regions 302, a plurality of gate structures 304, a plurality of word line contacts (e.g., gate contacts) 306, a plurality of active region contacts (e.g., source/drain contacts) 308, and a plurality of butted contacts 310 which form coupling connections between a drain of a first transistor and a gate of a second transistor.

Figure 3B:
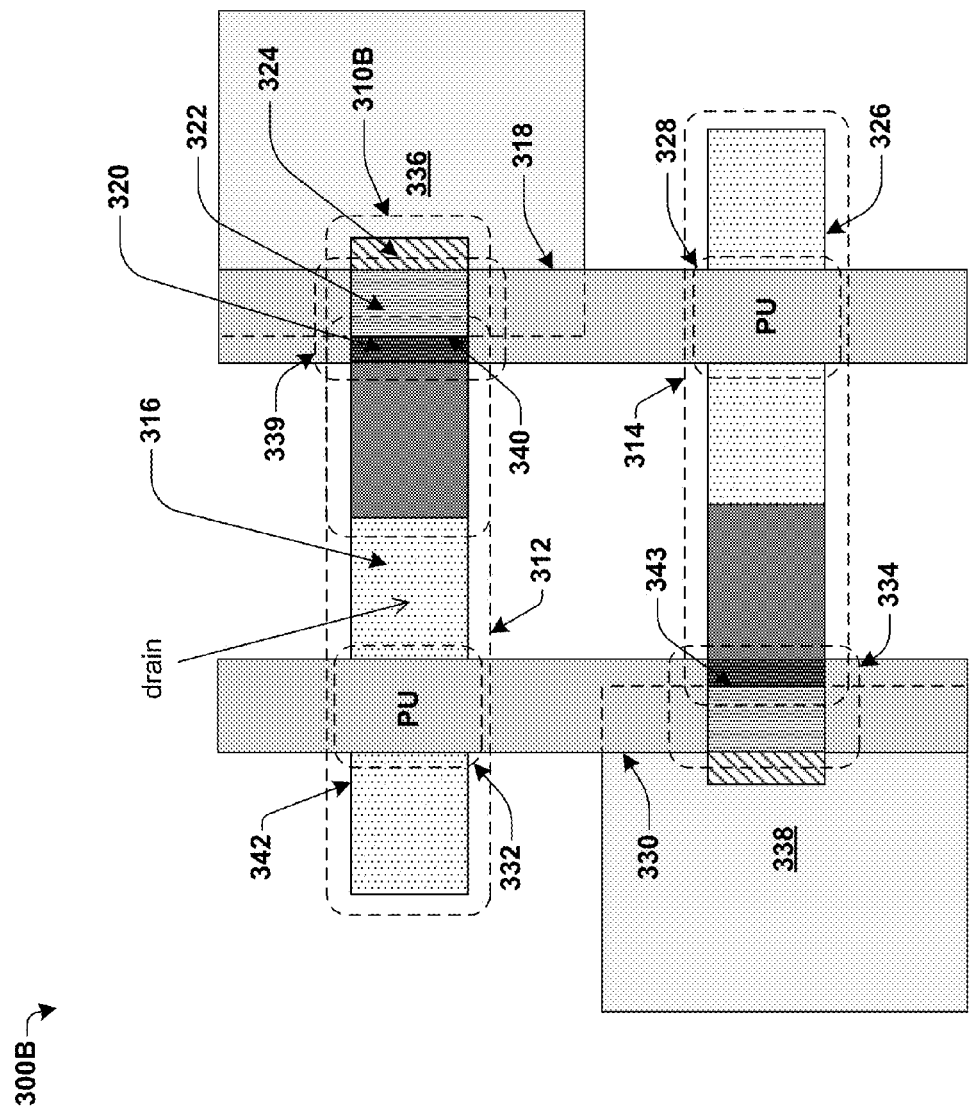
FIG. 3B illustrates an exploded view of a coupling connection formed between a first pull up transistor and a second pull up transistor.

FIG. 3B illustrates an exploded view of a coupling connection 300B formed by a butted contact 310B between a first pull up transistor 312 comprising a first gate structure 330 disposed over a first active region 342, and a second pull up transistor 314 comprising a second gate structure 318 disposed over a second active region 326. A drain 316 of the first pull up transistor 312 formed in the first active region 342 has been extended such that it overlaps the second gate structure 318 by an overlap value 320. The first gate structure 330 forms a first gate 332 of the first pull up transistor 312 and a second dummy gate 334 of the second pull up transistor 314. Likewise, the second gate structure 318 forms a second gate 328 of the second pull up transistor 314, and a first dummy gate 339 of the first pull up transistor 312. The butted contact 310B covers the second gate structure 318 (322) and extends past the second gate structure 318 in an overhang region 324. As will be demonstrated in subsequent embodiments, while the butted contact 310B of this embodiment extends past the second gate structure 318, the overhang region 324 is small enough such that a taper angle of the butted contact 310B will only contact the second gate structure 318 in the overhang region 324. A first isolation layer 336 is formed beneath the first dummy gate 339, and a first border 340 is formed between the first active region 342 and the first isolation layer 336. Likewise, a second border 343 is formed between the second active region 326 and a second isolation layer 338 formed beneath the second dummy gate 334. Also, the butted contact 310B is configured to couple the first active region 342 to the second gate 328 by contacting the first active region 342 and the second gate structure 318.

The performance of a Field-Effect Transistor (FET) may be enhanced by increasing the mobility of charge carriers with source and drain regions of the FET. One method to achieve this is to produce a strain inducing or high mobility layer within the source and drain regions. However, a strain inducing or high mobility layer (e.g., SiGe, Ge, or Si) formed near the interface between an active region and an isolation layer may result in a facet an edge of the active region at an interface of an isolation layer. The resulting topographical variation near the interface region results in a poor contact area, and increased contact resistance. As such, moving the interface region under an adjacent dummy gate (either through process tuning or layout design) results in a relatively smooth contact surface, increasing electrical performance without impacting the function of the FET.

Figure 4:
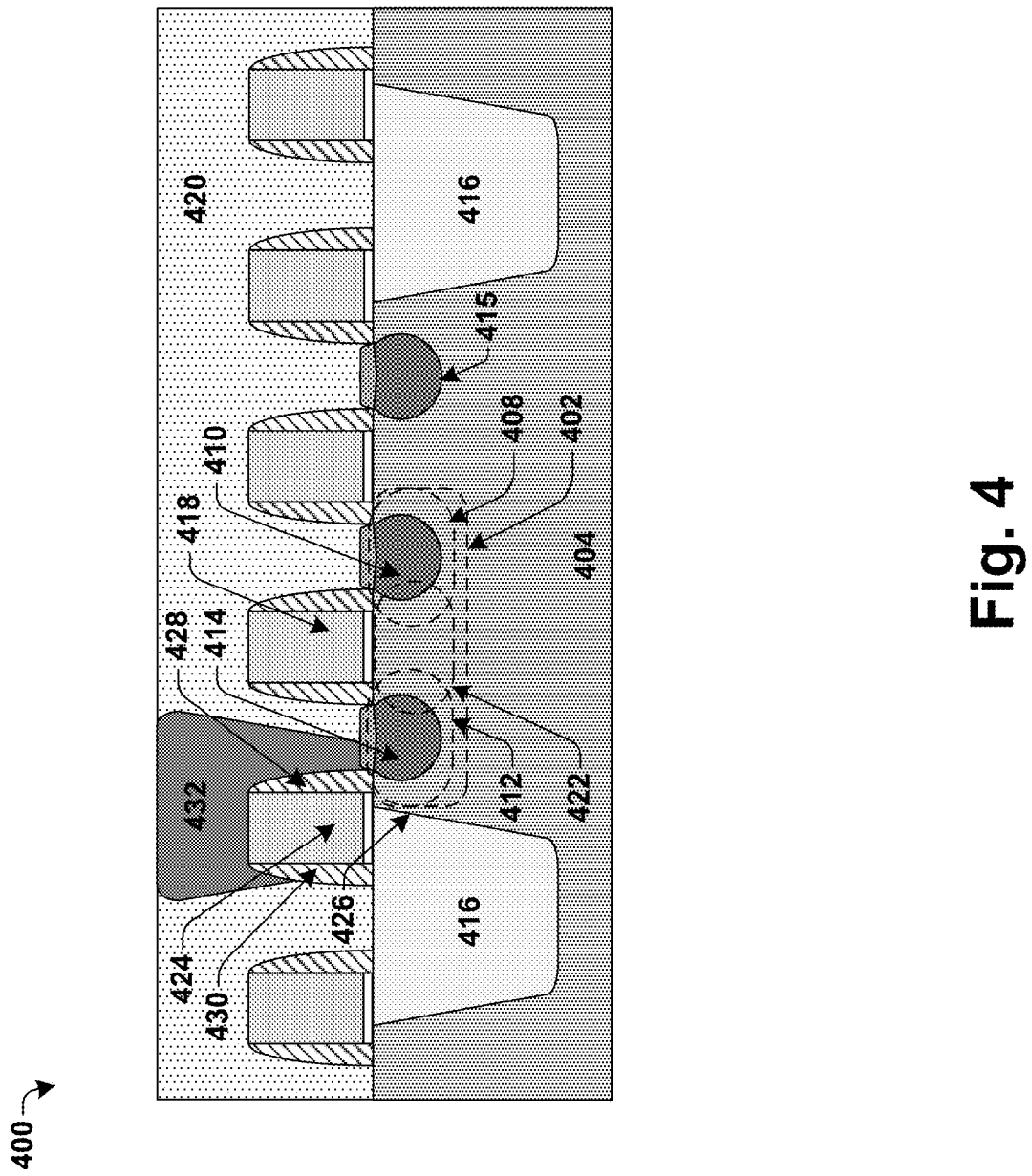
FIG. 4 illustrates some embodiments of a cross-sectional view of a coupling connection formed in an SRAM memory cell layout.

FIG. 4 illustrates some embodiments of a cross-sectional view 400 of a coupling connection formed in the SRAM memory cell layout 300A, comprising an active region 402 formed within a substrate 404 (e.g., Si) and surrounded by an isolation layer 416 (e.g., a shallow trench isolation, or STI formed from an oxide material such as $SiO_2$), which abuts the active region and isolates it from other regions of the substrate 404. The active region 402 comprises a source region 408, which comprises a first strain inducing or high mobility layer 410, and a drain region 412, which comprises a second strain inducing or high mobility layer 414. Both the first strain inducing or high mobility layer 410 and the second strain inducing or high mobility layer 414 comprise an isotropic profile 415, and may be formed by performing a wet chemical etch, a dry chemical etch, or a combination thereof, within the substrate 404 to produce a recess (with a profile depth of approximately 30 nm-100 nm). The recess is then filled with a respective strain inducing or high mobility layer which may be grown epitaxially on the substrate 404.

A first gate 418, that controls the flow of charge carriers from the source region 408 to the drain region 412, is formed within an inter-layer dielectric (ILD) 420 and disposed over a channel region 422 that separates the source region 408 and the drain region 412. A dummy gate 424 straddles a boundary 426 between the active region 402 and the isolation layer 416 at the surface of the substrate 404. The dummy gate 424 is abutted on one side by a first sidewall spacer 428 which also abuts the active region 402, and is abutted on an opposite side by a second sidewall spacer 430 which also abuts the isolation layer 416. Note that the boundary 426 between the active region 402 and the isolation layer 416 does not touch the first sidewall spacer 428 or second sidewall spacer 430, but has been moved completely under the dummy gate 424. A butted contact 432 couples the drain region 412 to the dummy gate 424, which forms a second gate elsewhere on the substrate 404.

Figure 5:
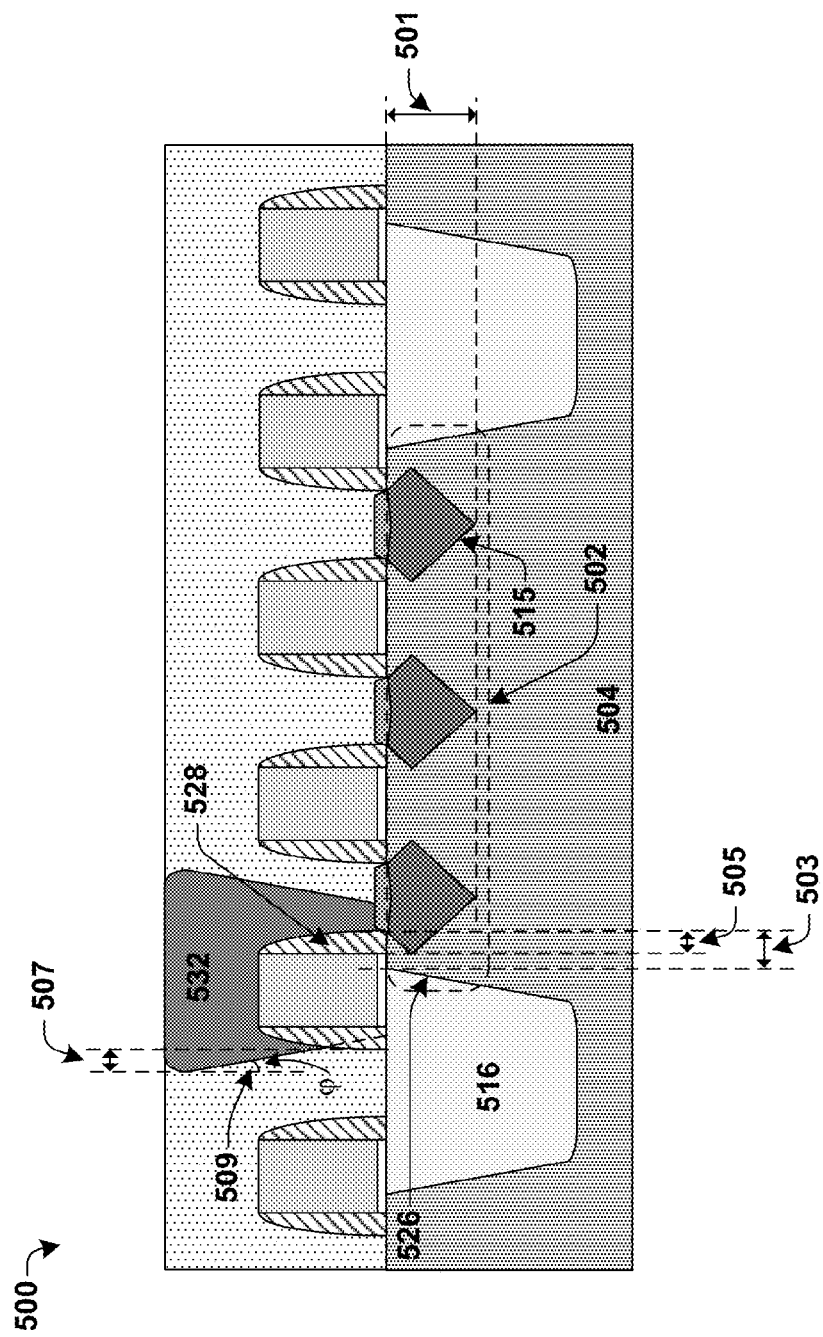
FIG. 5 illustrates some embodiments of a cross-sectional view of a coupling connection formed in an SRAM memory cell layout.

FIG. 5 illustrates some embodiments of a cross-sectional view 500 of a coupling connection formed in the SRAM memory cell layout 300A. Note that the embodiments of FIG. 5 are identical to the embodiments of FIG. 4 with the exception that a respective strain inducing or high mobility layer comprises an anisotropic profile 515. The anisotropic profile 515 may comprise a recess, with a profile depth 501 of approximately 30 nm-100 nm, formed by a wet chemical etch, a dry chemical etch, plasma etch, or a combination thereof, that has been filled (e.g., epitaxial growth) by a respective strain inducing or high mobility layer. For additional clarity, it will be appreciated that the embodiments of the cross-sectional view 500 also demonstrate that a first overlap 503 of a boundary 526 between an active region 502 and the isolation layer 516 at the surface of the substrate 504 that is larger than a width of the first sidewall spacer 528 (of approximately 10 nm-30 nm). Also, the overhang region 507 of the butted contact 532 is small enough such that a sidewall taper angle (φ) 509 prevents the butted contact 532 from contacting an isolation layer 516.

Figure 6:
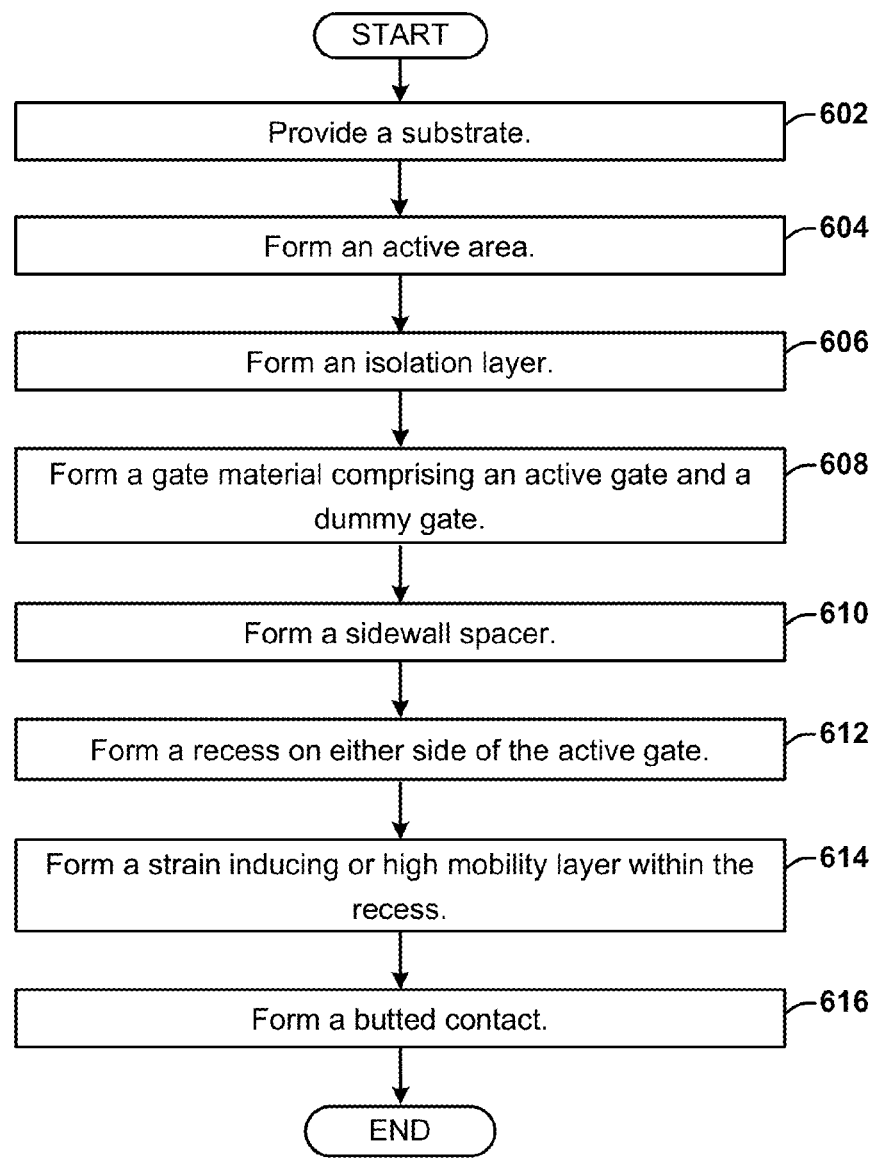
FIG. 6 illustrates a flow diagram of some embodiments of a method for fabricating a semiconductor memory device arrangement with butted a contact arrangement for coupling transistors.

FIG. 6 illustrates a flow diagram of some embodiments of a method 600 for fabricating a semiconductor memory device arrangement with butted a contact arrangement for coupling transistors. While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 602 a substrate is provided. The substrate may comprise a 300 mm or 450 mm crystalline wafer comprising silicon that has been doped with boron, phosphorus, arsenic, or antimony.

At step 604 an active region is formed within the substrate, and may comprise doping of the substrate.

At step 606 an isolation layer is formed within the substrate and configured to isolate the active region. The isolation layer may comprise an oxide layer (e.g., $SiO_2$) configured to electrically isolate the active region from other devices formed on the substrate.

At step 608 gate structures made of a conductive gate material are formed on the substrate. The gate structure comprises a gate of a first semiconductor memory device formed above the active region, and a dummy gate formed above a boundary between the active region and the isolation layer, straddling both the active region and the isolation layer. The dummy gate further comprises a gate of a second semiconductor memory device. The gate material may comprise a layer of Poly-Silicon above a layer of gate dielectric, wherein the gate dielectric comprises $SiO_2$ or a high-K dielectric.

At step 610 a sidewall spacer is formed which abuts the gate structure. The sidewall spacer may comprise a dielectric configured to isolate the gate from a source region and a drain region formed in subsequent steps.

At step 612 a recess is formed on either side of the gate by a wet chemical etch, a dry chemical etch, plasma etch, or a combination thereof. The recess may comprise an isotropic etch profile or an anisotropic etch profile.

At step 614 a source region or the drain region comprising a strain inducing layer or high mobility layer is formed in the recess. The strain inducing layer or high mobility layer may comprise a layer of epitaxial SiGe (e.g., $SiGe_{0.3}$), and is configured to provide increased charge carrier mobility.

At step 616 a butted contact is formed, and configured to couple the source region or the drain region of the first semiconductor memory device to the gate of the second semiconductor memory device. The butted contact may comprise a layer of tungsten.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising."

Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method for fabricating a butted a contact arrangement configured to couple two transistors, wherein an active region of a first transistor is coupled to a gate of a second transistor. The gate of the second transistor is formed from a gate material which comprises a dummy gate of the first transistor, and is configured to straddle a boundary between the active region of the first transistor and an isolation layer formed about the first transistor. The butted a contact arrangement results in a decreased contact resistance for the butted contact as compared to previous methods.

In some embodiments the present disclosure relates to a method. In this method, a first gate structure is formed over a first active region of a substrate to form a first transistor. The first gate structure also extends at least partially over a second active region of the substrate to establish a dummy gate over the second active region. A second gate structure is formed over the second active region to form a second transistor. A recess is formed within the second active region between the dummy gate and the second gate structure. A source/drain region is formed within the recess. A butted contact is formed to couple the source/drain region to the dummy gate.

In some embodiments the present disclosure relates to a method. In this method, a first gate structure is formed over a first active region of a substrate to form a first transistor. The first gate structure also extends at least partially over a second active region to establish a first dummy gate over the second active region. A second gate structure is formed over the second active region to form a second transistor. The second gate structure also extends at least partially over the first active region to establish a second dummy gate over the first active region. A butted contact is formed to couple the second active region to the first dummy gate, thereby coupling the second active region to the first gate structure of the first transistor.

Still other embodiments relate to a method. In this method, a first inverter is formed on a substrate by connecting a first p-type field-effect transistor (PFET) in series with a first n-type field-effect transistor (NFET). A second inverter is formed on the substrate by connecting a second PFET in series with a second NFET. A first drain region of the first PFET is connected to a second gate of the second PFET with a first butted contact. A second gate structure that forms the second gate of the second PFET straddles a first boundary between the first drain region of the first PFET and an inactive region of the substrate.

What is claimed is:

1. A method, comprising:
   forming a first gate structure over a first active region of a substrate to form a first transistor, wherein the first gate structure also extends at least partially over a second active region of the substrate to establish a dummy gate over the second active region;
   forming a second gate structure over the second active region to form a second transistor;
   forming a recess within the second active region between the dummy gate and the second gate structure;
   forming a source/drain region within the recess; and
   forming a butted contact to couple the source/drain region to the dummy gate.

2. The method of claim 1, further comprising disposing sidewall spacers along opposite sidewalls of the dummy gate, wherein at least one of the sidewall spacers resides entirely over the second active region.

3. The method of claim 1, wherein the recess is formed by a wet chemical etch, a dry chemical etch, or a combination thereof.

4. The method of claim 3, wherein forming the source/drain region within the recess comprises using an epitaxial growth process to form a strain inducing layer within the recess.

5. The method of claim 1, further comprising forming an isolation region that surrounds and abuts the second active region prior to forming the first gate structure, wherein a boundary of the second active region abuts the isolation region.

6. The method of claim 5, wherein the first gate structure is arranged over the isolation region and wherein a top portion of the butted contact overhangs past the first gate structure, and wherein the butted contact does not touch the isolation region.

7. A method, comprising:
forming a first gate structure over a first active region of a substrate to form a first transistor, wherein the first gate structure also extends at least partially over a second active region to establish a first dummy gate over the second active region;
forming a second gate structure over the second active region to form a second transistor, wherein the second gate structure also extends at least partially over the first active region to establish a second dummy gate over the first active region; and
forming a butted contact to couple the second active region to the first dummy gate, thereby coupling the second active region to the first gate structure of the first transistor.

8. The method of claim 7, further comprising:
forming a first isolation region, which surrounds and abuts the first active region;
forming a second isolation region, which surrounds and abuts the second active region;
disposing the second gate structure over a first boundary between the first active region and the first isolation region; and
disposing the first gate structure over a second boundary between the second active region and the second isolation region.

9. The method of claim 8, further comprising:
disposing a first sidewall spacer along a first sidewall of the first gate structure, wherein the first sidewall spacer extends over the second active region; and
disposing a second sidewall spacer along a second sidewall of the first gate structure, which is opposite the first sidewall, wherein the second sidewall spacer extends over the second isolation region;
wherein the first sidewall spacer does not touch the second isolation region and the second sidewall spacer does not touch the second active region.

10. The method of claim 7, wherein the butted contact connects a first p-type field-effect transistor (PFET) source or drain to a second PFET gate.

11. The method of claim 7, further comprising:
forming recesses within the first and second active regions; and
disposing strain inducing or high mobility layers within the recesses to form source and drain regions prior to connecting the butted contact.

12. The method of claim 11, wherein forming the recesses comprises an anisotropic etch configured to selectively etch along one of more lattice planes of the substrate.

13. The method of claim 11, wherein the strain inducing or high mobility layers are grown epitaxially within the recesses.

14. The method of claim 11, wherein the strain inducing or high mobility layers comprise SiGe, Ge, Si, or any combination thereof.

15. A method, comprising:
forming a first inverter on a substrate by connecting a first p-type field-effect transistor (PFET) in series with a first n-type field-effect transistor (NFET);
forming a second inverter on the substrate by connecting a second PFET in series with a second NFET; and
connecting a first drain region of the first PFET to a second gate of the second PFET with a first butted contact, wherein a second gate structure that forms the second gate of the second PFET straddles a first boundary between the first drain region of the first PFET and an inactive region of the substrate.

16. The method of claim 15, further comprising connecting a second drain region of the second PFET to a first gate of the first PFET with a second butted contact, wherein a first gate structure that forms the first gate of the first PFET straddles a second boundary between the second drain region of the second PFET and the inactive region of the substrate.

17. The method of claim 16, further comprising:
forming recesses within active regions of the first and second PFETs; and
disposing strain inducing or high mobility layers within the recesses to form source and drain regions prior to connecting the first and second butted contacts.

18. The method of claim 17, wherein the strain inducing or high mobility layers comprise SiGe, Ge, Si, or any combination thereof, and are grown epitaxially within the recesses.

19. The method of claim 15, wherein the inactive region of the substrate comprises an isolation region, which surrounds the first and second PFETs.

20. The method of claim 19, wherein the isolation region comprises a shallow trench isolation (STI) region.

* * * * *